(12) United States Patent
Rajagopalan et al.

(10) Patent No.: US 8,055,460 B2
(45) Date of Patent: Nov. 8, 2011

(54) METHOD AND APPARATUS FOR MONITORING SOLENOID HEALTH

(75) Inventors: Satish Rajagopalan, Rochester Hills, MI (US); Mutasim A. Salman, Rochester Hills, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 373 days.

(21) Appl. No.: 12/390,126

(22) Filed: Feb. 20, 2009

(65) Prior Publication Data

US 2010/0217545 A1 Aug. 26, 2010

(51) Int. Cl.
*G01R 31/02* (2006.01)
*G06F 17/40* (2006.01)

(52) U.S. Cl. ............... 702/58; 702/63; 702/64; 702/65; 324/415; 324/418

(58) Field of Classification Search .................... 702/58, 702/63, 64, 65, 183
See application file for complete search history.

(56) References Cited

U.S. PATENT DOCUMENTS

| | | | |
|---|---|---|---|
| 5,808,471 A | | 9/1998 | Rooke et al. |
| 5,818,678 A | * | 10/1998 | Berg et al. ................. 361/152 |
| 6,056,372 A | * | 5/2000 | Kamei et al. ............... 303/155 |
| 6,917,203 B1 | | 7/2005 | Perotti et al. |
| 7,054,772 B2 | * | 5/2006 | Iannone et al. ............. 702/65 |
| 7,483,253 B2 | | 1/2009 | Schumacher |
| 2009/0265125 A1 | * | 10/2009 | Zhang ............................ 702/63 |

OTHER PUBLICATIONS

Chyuan-Yow Tseng and Chiu-Feng Lin, A Simple Method for Automotive Switching-type Solenoid Valve Stuck Fault Detection, Int. J. Heavy Vehicle Systems, vol. 14, No. 1, 2007.

* cited by examiner

*Primary Examiner* — Hal Wachsman
(74) *Attorney, Agent, or Firm* — Quinn Law Group, PLLC

(57) ABSTRACT

A method for monitoring the state of health (SOH) of a solenoid powered by a battery includes measuring a voltage and a current supplied to the solenoid by the battery, using a processor to determine each of an equivalent resistance and inductance of the solenoid using the voltage and the current, comparing the equivalent resistance and the equivalent inductance to a corresponding calibrated threshold, and recording deviations from the corresponding calibrated thresholds as a pair of SOH values. A trend of the SOH values is continuously monitored, and an appropriate control action is taken when either SOH value drops below a calibrated lower limit. A solenoid monitoring system includes a solenoid, voltage and current sensors, and a controller having an algorithm for continuously monitoring a state of health (SOH) of the solenoid as set forth above.

17 Claims, 3 Drawing Sheets

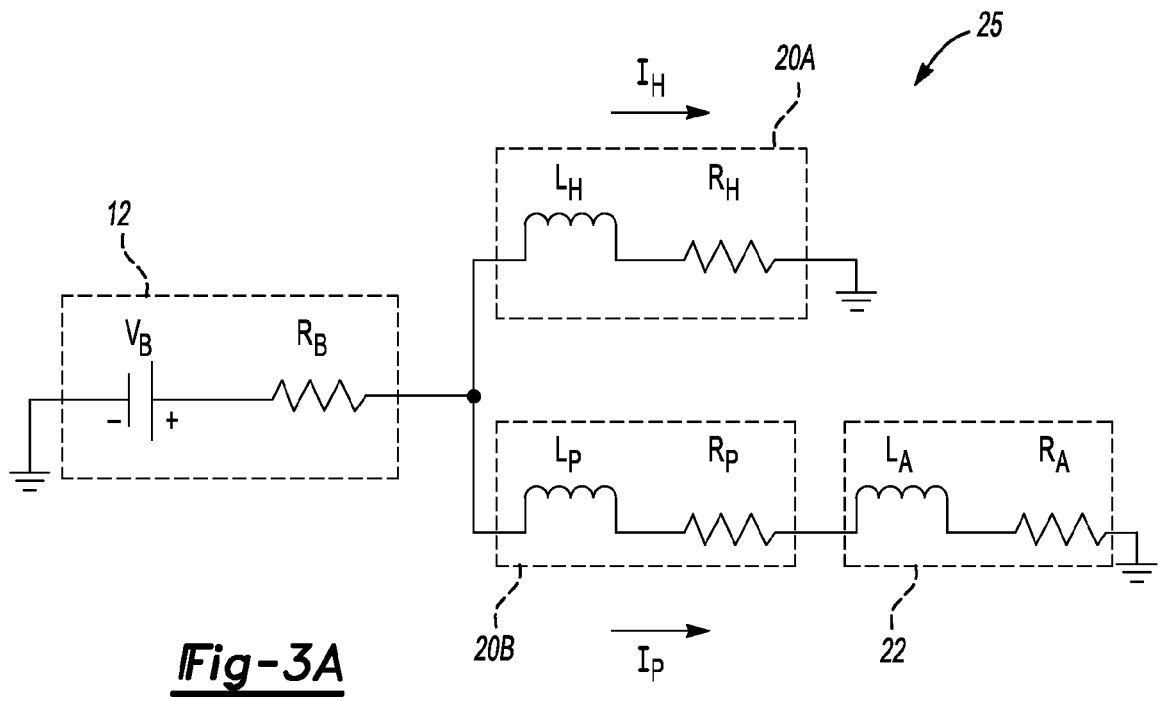
*Fig-3A*
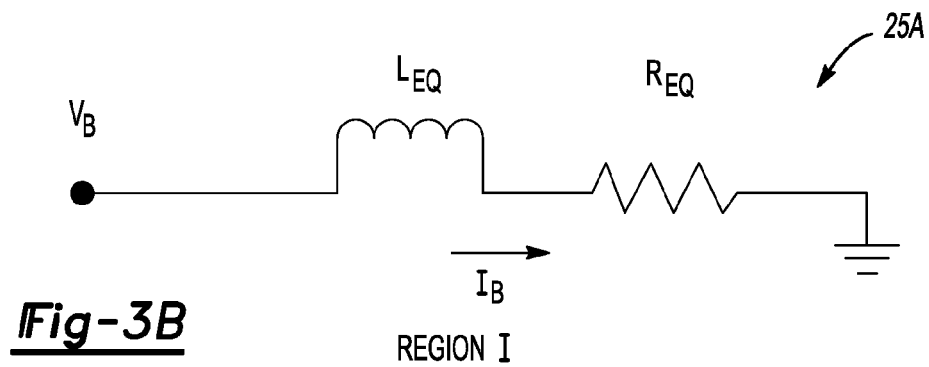
*Fig-3B* REGION I
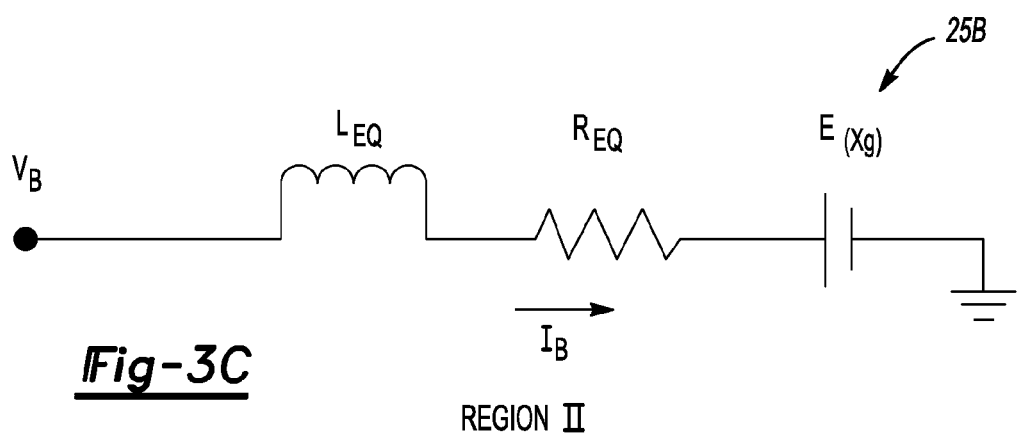
*Fig-3C* REGION II

METHOD AND APPARATUS FOR MONITORING SOLENOID HEALTH

TECHNICAL FIELD

The present invention relates generally to electro-mechanical solenoid devices, and more particularly to a method and an apparatus for continuously monitoring the ongoing state of health of a solenoid device.

BACKGROUND OF THE INVENTION

Solenoid devices or solenoids are linear actuator devices having a host of useful applications. For example, solenoids typically serve as a reliable type of on/off switch for precise operational control of various devices, e.g., electrical motors, valves, assembly robots, etc. Solenoids are ordinarily configured as electromechanical devices, although hydraulic and pneumatic variants exist that provide similar utility using different motive forces. A typical solenoid of the electromagnetic variety includes one or more coils of conductive wire surrounding a moveable piston portion or plunger, all of which is positioned within a solid ferromagnetic core. That is, a single-coil solenoid can be used in conjunction with a return spring, while a dual-coil solenoid can include each of a pull-in coil and a hold-in coil, with each coil dedicated to the specified function.

As with an electric motor, the passage of an electrical current though the solenoid coil induces a magnetic field around the coil. Selective application of the magnetic field thus moves the plunger in a particular and controllable manner, either by pushing or pulling the coil in a desired direction. That is, the induced magnetic field either attracts or repels the plunger, which is ordinarily constructed of iron or steel to facilitate this response. When the electrical current supplied to the solenoid is terminated, the induced magnetic field likewise terminates, thus allowing a return spring to move the plunger back to its original or de-energized position.

While the operational diagnosis of a solenoid can be provided using various means, such as by detecting the rate of a rise and fall in a measured solenoid current to determine if the solenoid is presently operating within specification, conventional methods can require the commitment of substantial computational resources, and/or the use of complex waveform or pattern recognition techniques. Additionally, such methods can be relatively expensive to implement due to the need for analog circuitry dedicated to the detection of electrical current transitions. Moreover, a determination of whether or not a particular solenoid is presently performing to specification does not provide a prognostic or predictive capability, and therefore can be less than optimal when used to predict remaining life of a solenoid. Such predictive value can be particularly useful when used in certain applications, such as but not limited to the monitoring of a solenoid used for controlling a vehicular starter motor.

SUMMARY OF THE INVENTION

Accordingly, a method is provided for monitoring the ongoing state of health or SOH of an electromechanical solenoid device or solenoid, i.e., a solenoid powered via electrical current supplied by a battery or other suitable supply of electrical energy. Execution of the method, which can be embodied as a computer-executable algorithm as explained hereinbelow, thus enables at least some degree of estimation of remaining life of the solenoid, thus predicting a failure point well in advance of the actual occurrence of such an event. For example, in an exemplary solenoid used in conjunction with a vehicular starter motor, the predictive value provided by the method can enhance the perceived reliability of the vehicle by minimizing instances of walk-home situations in which an unexpected solenoid failure is the root cause.

In particular, the method includes measuring, sensing, or otherwise determining a voltage and current supplied to the solenoid, determining by calculation or estimation a total or equivalent resistance and inductance of the solenoid, as that term will be understood by those of ordinary skill in the art, using the voltage and current, and recording deviations of the equivalent resistance and inductance from a calibrated value or threshold as a pair of SOH values, i.e., an SOH resistance value and an SOH inductance value. The method continuously monitors the trend in the SOH values, and executes a suitable control action when either SOH value drops below a calibrated lower limit. Optionally, an SOH value for an opposing or back electromotive force (EMF) of the solenoid can also be calculated and used in a similar manner, as explained below.

Additionally, a solenoid monitoring system includes the solenoid described above, a current sensor, a voltage sensor, and a computational device or computer, referred to herein as a controller, that is in communication with the sensors. The controller includes an algorithm for continuously monitoring the SOH of the solenoid device by determining the equivalent resistance and inductance, calculating SOH factors for the resistance and inductance, and optionally the back-EMF, and executing a control action in a particular manner when the values drop below a minimum threshold. The system can also estimate the back-EMF of a plunger of the solenoid device using a predetermined parameter estimation technique as set forth herein.

Within the scope of the invention, the total equivalent resistance and inductance of the solenoid device can be determined via calculation or estimation depending on the particular design or configuration of the solenoid device. That is, in a solenoid device that does not move until an exponential solenoid current reaches a peak or a maximum before the plunger begins to move, a first method can be used to calculate the equivalent resistance and inductance, while a second method involving parameter estimation can be used in a solenoid that begins to move before the solenoid current reaches such a peak. The back-EMF of the solenoid device can be estimated via a predetermined parameter estimation technique, e.g., regression analysis, least squares, maximum likelihood, etc., and compared to a back-EMF threshold in order to determine any potential performance issues or degradation of the plunger.

The above features and advantages and other features and advantages of the present invention are readily apparent from the following detailed description of the best modes for carrying out the invention when taken in connection with the accompanying drawings.

BRIEF DESCRIPTION OF THE DRAWINGS

FIG. 3A is a schematic electrical circuit diagram for a starting circuit having an exemplary dual-coil solenoid;

FIG. 3B is an equivalent circuit diagram for the starting circuit of FIG. 3A in a first solenoid operating region;

FIG. 3C is an equivalent circuit diagram for the starting circuit of FIG. 3A in a second solenoid operating region.

DESCRIPTION OF THE PREFERRED EMBODIMENTS

Figure 1:
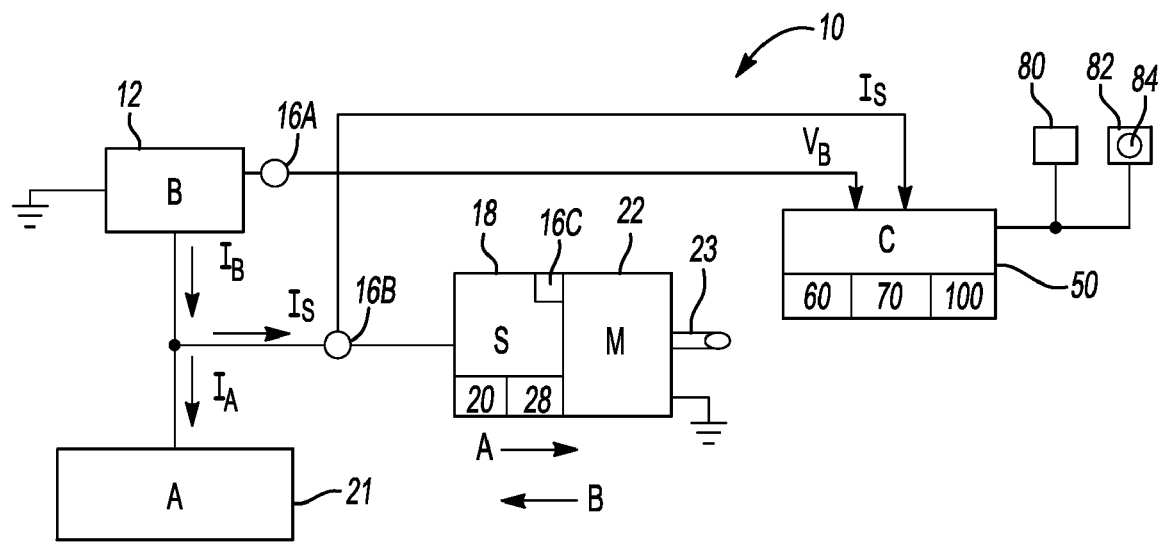
FIG. 1 is a schematic illustration of a solenoid monitoring system operable for monitoring the state of health (SOH) of an electro-mechanical solenoid device.

Referring to the drawings, wherein like reference numbers correspond to like or similar components throughout the several figures, and beginning with FIG. 1, a solenoid monitoring system 10 includes a solenoid device or a solenoid (S) 18 connected to an electric motor (M) 22 or other solenoid-controllable device, e.g., a vehicular starter motor, a motorized valve, a robot, etc. having an output shaft or member 23. Motion of the member 23 can be harnessed as needed to perform any of a variety of useful work. The solenoid 18 is of the electro-mechanical type, and therefore includes one or more wire coils 20 surrounding a moveable piston or plunger 28, with the motion of plunger 28 indicated in FIG. 1 by the arrows A and B. The solenoid 18 can be configured as either a single coil or a dual-coil solenoid as described above without departing from the intended scope of the invention.

The system 10 includes an electronic control unit or controller (C) 50 and a pair of sensors 16A, 16B, with the sensors 16A, 16B being adapted for measuring, sensing, detecting, or otherwise determining or collecting a predetermined set of electrical values, and for relaying the values to the controller 50. The solenoid 18 can be electrically connected to a battery (B) 12 or other suitable electrical energy supply, and is in wireless or hardwired communication with the sensors 16A, 16B to receive values corresponding to the battery voltage ($V_B$) and the solenoid current ($I_S$), respectively. A temperature sensor 16C can also be provided for use in adjusting certain measurements as set forth below.

Depending on the particular system in which the system 10 is used, the battery 12 can also be electrically connected to one or more accessories (A) 21. For example, if the system 10 is used in conjunction with a vehicle (not shown), the accessories 21 can include a radio, interior or exterior lights, seat warmers or positioning devices, etc. The solenoid 18 can also serve as a starter solenoid or electromagnetic switch for control of a starter motor. If one or more accessories 21 are used, the electrical current ($I_S$) supplied to the solenoid 18 can be determined or calculated by the controller 50, such as by subtracting the known or estimated accessory current ($I_A$) from the known or measured battery current ($I_B$). Likewise, if no such accessories 21 are used, the solenoid current ($I_S$) is equal to the battery current ($I_B$).

Still referring to FIG. 1, the controller 50 includes one or more microprocessors or central processing units (CPU) 60 and sufficient computer-accessible memory 70. Such memory 70 can include, for example, read only memory (ROM), random access memory (RAM), electrically-programmable read only memory (EPROM), etc., of a size and speed sufficient for executing the method or algorithm 100 as set forth below with reference to FIG. 4. The controller 50 can also be provided with other required hardware, such as a high speed clock, requisite analog to digital (A/D) and digital to analog (D/A) circuitry, any necessary input/output circuitry and devices (I/O), as well as appropriate signal conditioning and/or buffer circuitry. Any algorithms resident in the controller 50 or accessible thereby, including the algorithm 100 of the invention as described below, can be stored in memory 70 and automatically executed to provide the respective functionality.

The controller 50 can be electrically connected to an audio/visual indicator 80 and/or a display 84, with the display 84 being adapted for displaying information or a text message 82. For example, the indicator 80 can be a warning lamp, the activation of which can sound an audible tone or alarm alone or in conjunction with illumination of the indicator 80. Likewise, the display 84 can be a display portion of a control panel or a marquee when used, for example, on a manufacturing floor, or as a portion of an instrument panel, center console, rear view mirror assembly, etc. (not shown) of a vehicle when used aboard a vehicle, such as in the example of a solenoid 18 used for controlling a motor 22 configured as a vehicular starter motor.

Figure 2:
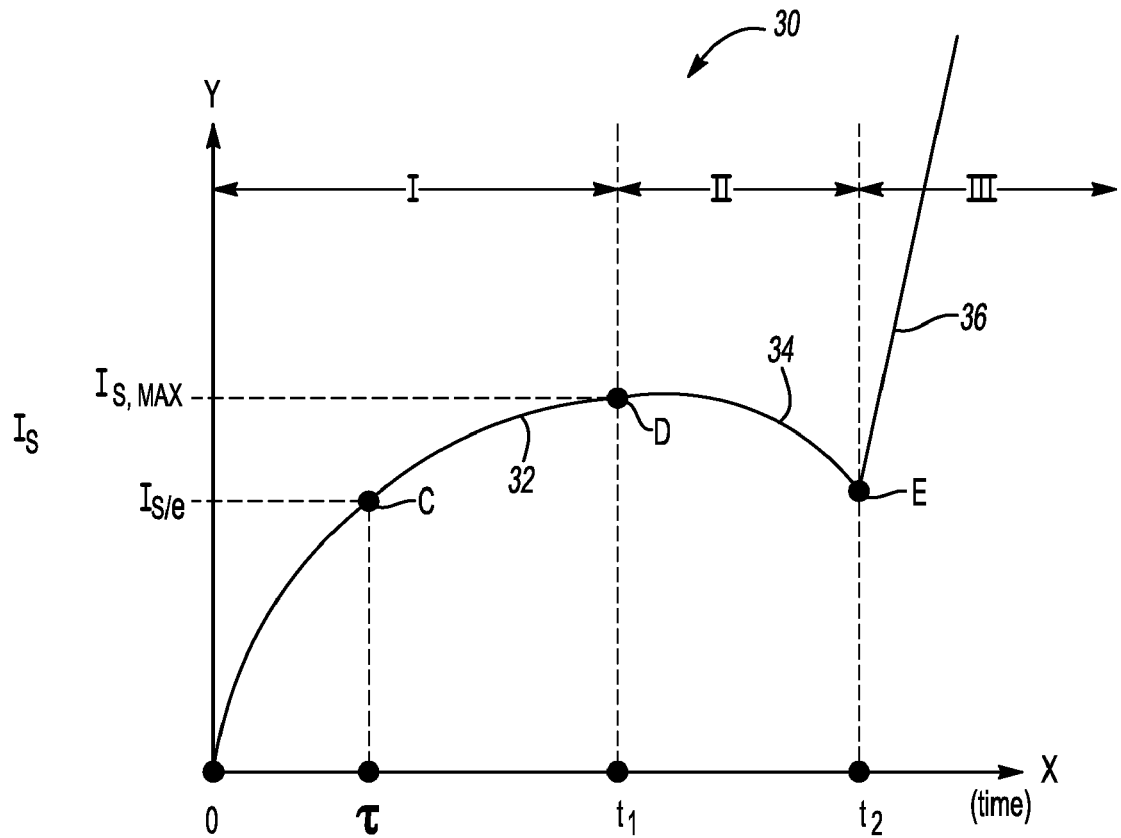
FIG. 2 is a graphical illustration of a set of performance curves for an exemplary solenoid usable within the monitoring system of FIG. 1.

Referring to FIG. 2, a performance curve 30 for the solenoid 18 shown in FIG. 1 includes three solenoid operating regions I, II, and III, with the Y-axis denoting the solenoid current ($I_S$), and with the X-axis denoting time (t). With respect to region I, the curve segment 32 in this region describes the exponential rise in solenoid current ($I_S$) from t=0 until a peak or maximum solenoid current ($I_{S,MAX}$) is reached at point D, or at t1. Within the segment 32, the point C corresponds to the exponential time constant (τ), as that term will be understood in the art. That is, in region I the solenoid current ($I_S$) increases exponentially, and is dictated by the equivalent resistance ($R_{EQ}$) and the equivalent inductance ($L_{EQ}$) of the solenoid 18. Therefore, the solenoid current ($I_S$) at point C is approximately 63% of the maximum, i.e., $I_{S,MAX}/e$.

With respect to region II, this region begins at point D and describes the duration or interval during which the plunger 28 of the solenoid 18 (see FIG. 1) begins to move in response to an induced magnetic field, as set forth above. In region II, the segment 34 between points D and E represents a region in which solenoid inductance increases, thus resulting in a decrease in solenoid current ($I_S$). In other words, an opposing electro-motive force, referred to hereinafter as the back-EMF, is created as the plunger 28 moves in response to the induced magnetic field.

Finally, region III or segment 36 commences at point E, i.e., the point in time at which the motor 22 starts. For example, at point E the solenoid 18 configured as a switch can be fully actuated, thus allowing the battery 12 of FIG. 1 to energize the motor 22.

Referring to FIG. 3A, an exemplary electrical circuit 25 is shown for an exemplary starting circuit using the solenoid 18 of FIG. 1. The circuit 25 represents the battery 12 via the battery voltage ($V_B$) and the battery resistance ($R_B$). The solenoid 18 in this example is a dual-coil solenoid as described above, and therefore includes a hold-in coil 20A and a pull-in coil 20B, as those terms are understood in the art. The hold-in coil 20A and the pull-in coil 20B can be represented by each of an inductance ($L_H$, $L_P$, respectively) and a resistance ($R_H$ and $R_P$, respectively). Likewise, the motor 22 of FIG. 1, or more precisely the windings thereof, can be represented by an inductance ($L_A$) and a resistance ($R_A$).

Referring to FIG. 3B, the circuit 25 of FIG. 3A can be reduced in region I of FIG. 2 to the equivalent circuit 25A. That is, within region I, the battery voltage ($V_B$) can be determined using the equation $V_B=(I_S)(R_{EQ})+(L_{EQ})(\Delta I_S/\Delta t)$. The rate of change of the solenoid current ($I_S$) can be modeled and plotted as: $I_S(t)=(V_B/R_{EQ})(1-e^{-t/\tau})$. The time constant (τ) for the solenoid current to rise to the level of (1/e) of the maximum or peak current ($I_{S,MAX}$) can thus be measured, and the equivalent inductance ($L_{EQ}$) can be calculated as $L_{EQ}=\tau*R_{EQ}$.

As will be understood by those of ordinary skill in the art, the total or equivalent resistance and inductance of any electrical device can be calculated using basic circuit analysis equations. For example, the respective resistance and inductance values of resistors and inductors in series can be added to determine the equivalent resistance and inductance, while (N) resistors or inductors in parallel can be calculated via the equation $1/R_{EQ}=1/R_1+1/R_2+\ldots 1/R_N$ and $1/L_{EQ}=1/L_1+1/L_2+\ldots 1/L_N$.

Also as will be understood by those of ordinary skill in the art, solenoid designs can vary, with some types of solenoids reaching a maximum current or steady peak before the plunger 28 begins to move, and other types having a plunger 28 that moves well in advance of reaching such a peak. In the first type of solenoid, i.e., a type reaching a peak or maximum current ($I_{S, MAX}$) before motion of the plunger 28, the rate of change of the solenoid current ($I_S$) is zero at the peak of point D, and at this point D the above equation reduces to: $V_B=(I_S)(R_{EQ},)$ i.e., with $R_{EQ}=V_B/I_S$ at the peak of point D.

In the second type of solenoid, the equivalent resistance ($R_{EQ}$), and the equivalent inductance ($L_{EQ}$) at point D can be estimated using a predetermined parameter estimation technique, for example regression analysis, linear least squares, polynomial least squares, recursive least squares, etc. That is, using the linear form $y=ax+b$, with $y=\Delta I_S/\Delta t$, $x=I_S$, $a=-R_{EQ}/L_{EQ}$, and $b=1/L_{EQ}$, it follows that $\Delta I_S/\Delta t=(-R_{EQ}/L_{EQ})(I_S)+1/L_{EQ}$. Thus, using regressive least squares (RLS) techniques, $R_{EQ}=-a/b$ and $L_{EQ}=1/b$. Regardless of the particular type of solenoid 18 used in the system 10 of FIG. 1, the performance of the solenoid 18 in region I can be modeled.

Referring to FIG. 3C, an equivalent circuit 25B is shown for region II of FIG. 2. In region II, the battery voltage ($V_B$) can be determined by the equation: $V_B=(I_S)(R_{EQ})+(L_{EQ})(dI_S/dt)+E(x_g)$, with the variable $E(x_g)$ being equal to the back-EMF of the solenoid 18 as a function of travel of the plunger 28. The equivalent resistance ($R_{EQ}$) from region I can be used, and $E(x_g)$ and $L_{EQ}$ can be estimated using a predetermined parameter estimation technique as set forth above.

Figure 4:
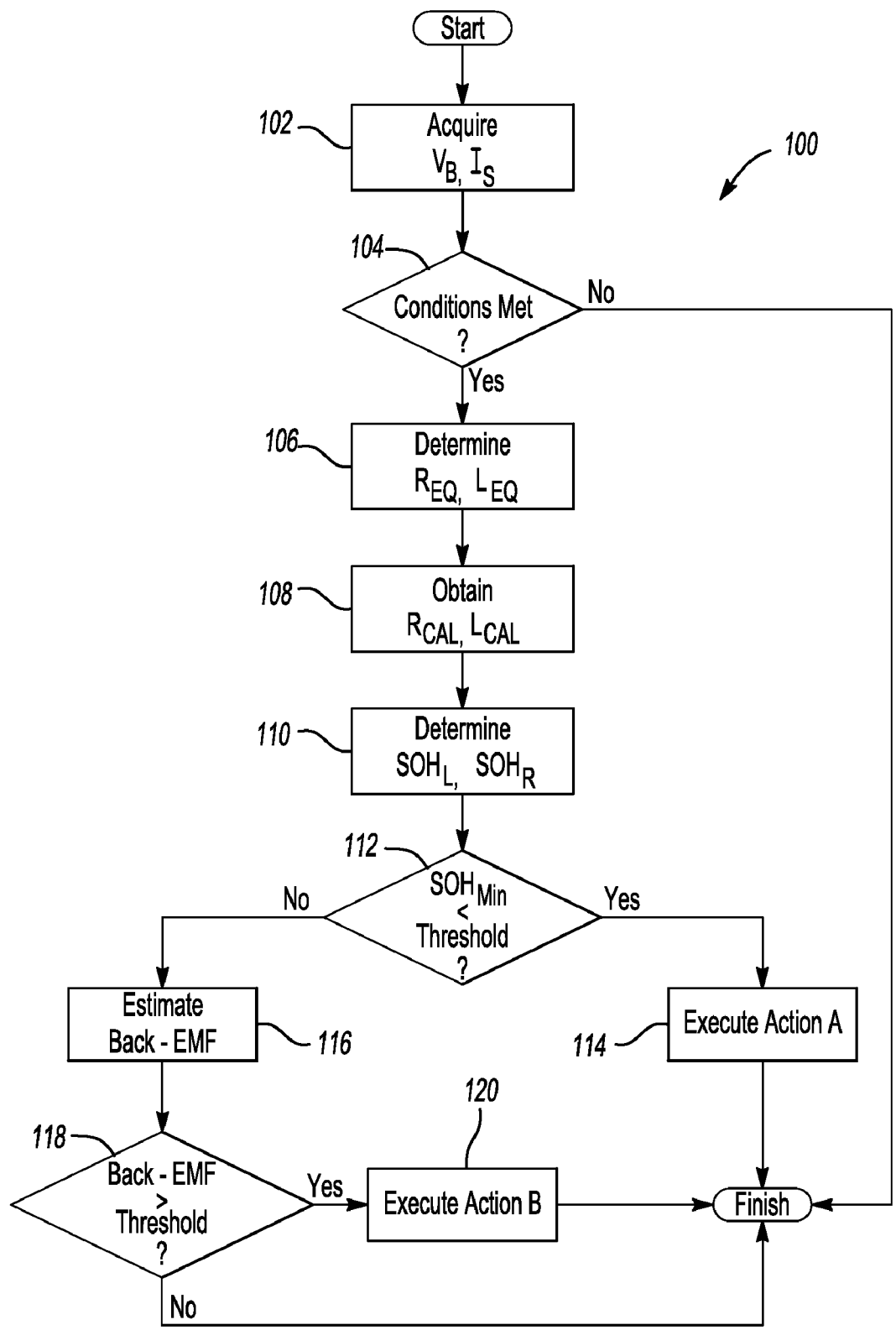
FIG. 4 is a graphical flow chart describing an algorithm suitable for executing the method of the invention.

Referring to FIG. 4, and with particular reference to the various elements of the system 10 shown in FIG. 1, the method of the invention is executable by the controller 50 using the algorithm 100. Beginning at step 102, the values of the battery voltage ($V_B$) and the solenoid current ($I_S$) are measured, detected, or otherwise acquired, such as by using the sensors 16A, 16B as explained above. If an optional accessory 21 draws power from the battery 12 along with the solenoid 18, this value is first considered when determining the solenoid current ($I_S$), and prior to energizing the solenoid 18. For example, the actual or estimated current draw of the accessory 21 or multiple accessories 21 is first subtracted from a measured or known battery current ($I_B$) to determine the solenoid current ($I_S$) before proceeding to step 104.

At step 104, the algorithm 100 can check a set of predetermined conditions and, using these conditions, can determine whether it is appropriate to proceed. For example, the algorithm 100 can sense or detect a "power on" or start signal for starting the motor 22 or other connected device, or can determine if the motor 22 or other device connected to the solenoid 18 is operating as expected, such as by referencing diagnostic codes (not shown) in the controller 50, by conducting a test of the motor 22 or other such components, etc. If the predetermined conditions are met at step 104, the algorithm 100 proceeds to step 106. Otherwise, the algorithm 100 is finished.

At step 106, the equivalent resistance ($R_{EQ}$) and the equivalent inductance ($L_{EQ}$) of the solenoid 18 are determined using any appropriate means. For a solenoid of the first type explained above, i.e., a solenoid reaching a peak or maximum solenoid current before motion of the plunger begins, the algorithm 100 can calculate the equivalent resistance ($R_{EQ}$) and the equivalent inductance ($L_{EQ}$) using the peak current ($I_{S, MAX}$) and the time constant $\tau$. For a solenoid of the second type, i.e., a solenoid that does not reach such a peak or maximum solenoid current before motion of the plunger begins, the algorithm 100 can use the parameter estimation techniques set forth previously hereinabove in order to estimate the values of the equivalent resistance ($R_{EQ}$) and the equivalent inductance ($L_{EQ}$). However these values are ultimately determined, the algorithm 100 proceeds to step 108 once such a determination is made.

At step 108, the algorithm 100 can obtain nominal or calibrated values for resistance ($R_{CAL}$) and the inductance ($L_{CAL}$), i.e., associated resistance and inductance values previously determined and recorded as reference values for a known "good" solenoid. These calibrated values can be adjusted as needed for the present temperature of the solenoid 18, which can be readily determined using a temperature sensor 16C as shown in FIG. 1. Likewise, the values for $R_{EQ}$ and $L_{EQ}$ can be adjusted for temperature to match the temperature at which the calibrated values were originally determined. The calibrated values for the resistance ($R_{CAL}$) and the inductance ($L_{CAL}$) can be stored temporarily in a memory location resident in or accessible by the controller 50, after which the algorithm 100 proceeds to step 110.

At step 110, using the calibrated values from step 108, i.e., $R_{CAL}$ and $L_{CAL}$, a state of health of the solenoid 18, hereinafter referred to as the SOH factor, is calculated for the solenoid 18 for each of the resistance and the inductance values. In particular, an SOH factor for the resistance, or $SOH_R$, can be calculated using the equation:

$$SOH_R = 1-(\Delta R/R_{EQ})$$

with $\Delta R$ defining the absolute value of the deviation of the equivalent value of the resistance, i.e., $R_{EQ}$, determined at step 106 above, from the calibrated or threshold resistance value ($R_{CAL}$), i.e., $\Delta R=|R_{EQ}-R_{CAL}|$. The same calculation is performed to determine an SOH factor for the inductance, or $SOH_L$.

The comparative values can be used to further isolate the root cause of failure within the solenoid 18. For example, when the equivalent resistance value, or $R_{EQ}$, exceeds that of the corresponding calibrated threshold ($R_{CAL}$) by a predetermined margin, determined during calibration and therefore usable as a threshold value, the result can indicate an open circuit in the solenoid 18. Likewise, if the equivalent resistance value ($R_{EQ}$) is less than that of the corresponding calibrated threshold ($R_{CAL}$) by a predetermined margin, also determined during calibration and therefore usable as another threshold or lower limit value, the result can indicate a shorted winding in the solenoid 18. If a dual-coil solenoid is used, similar comparisons can be used to determine whether a hold-in coil or a pull-in coil is open. The values of each SOH factor, i.e., $SOH_R$ and $SOH_L$, can be plotted or otherwise recorded in an accessible manner within memory of the controller 50, after which the algorithm 100 proceeds to step 112.

At step 112, the values of the SOH factors are compared, and the minimum value is selected. If the minimum of the two SOH factors $SOH_R$ and $SOH_L$ is less than a predetermined or calibrated threshold, the algorithm 100 proceeds to step 114. Otherwise, the algorithm 100 proceeds to step 116.

At step 114, the controller 50 determines that the winding 20 of the solenoid 18 is likely faulty, and executes a control action, such as by setting an appropriate flag or recording a suitable value indicating such a prognosis, or alternately by activating one or both of the indicator 80 and display 84. The algorithm 100 is then finished.

At step 116, and during region II, the algorithm 100 uses the equivalent resistance value ($R_{EQ}$) determined at step 106, and estimates the back-EMF or $E(x_g)$ using a suitable parameter estimation technique as set forth above, e.g., regressive least squares (RLS) in an exemplary embodiment. The algorithm 100 then proceeds to step 118.

At step 118, the algorithm 100 determines if the back-EMF, or $E(x_g)$, exceeds a calibrated threshold. Alternately or concurrently, step 118 can also include executing a similar state of health (SOH) determination as explained above at steps 110 and 112. That is, after the back-EMF is estimated or otherwise determined at step 116, a calibrated back-EMF value, or $E_{CAL}$, can be referenced in memory, and a deviation or $\Delta E$ value can be determined as $\Delta E = |E(x_g) - E_{CAL}|$. If so, the algorithm 100 proceeds to step 120. Otherwise, the algorithm 100 is finished.

At step 120, the controller 50 determines that the plunger 28 is likely faulty, and sets an appropriate flag or records a suitable value indicating such a prognosis. The controller 50 can alternately or concurrently activate the indicator 80 and/or display 84 as set forth above. The algorithm 100 is then finished.

While the best modes for carrying out the invention have been described in detail, those familiar with the art to which this invention relates will recognize various alternative designs and embodiments for practicing the invention within the scope of the appended claims.

The invention claimed is:

1. A method for monitoring the state of health (SOH) of a solenoid powered by a battery, the method comprising:
   measuring a voltage and a current supplied to the solenoid by the battery;
   using a controller to determine each of an equivalent resistance and an equivalent inductance of the solenoid using the voltage and the current;
   comparing each of the equivalent resistance and the equivalent inductance to a corresponding calibrated threshold;
   recording deviations of each of the equivalent resistance and the equivalent inductance from the corresponding calibrated threshold on a computer-readable medium as a pair of SOH values;
   continuously monitoring, via the controller, a trend of each of the pair of SOH values with respect to a corresponding calibrated lower limit; and
   automatically executing a first control action providing a first prognosis of the solenoid when either of the pair of SOH values drops below the corresponding calibrated lower limit.

2. The method of claim 1, wherein automatically executing a control action includes one of: recording a diagnostic code on the computer-readable medium, activating an audio/visual signal, and displaying a message on a display device.

3. The method of claim 1, including an accessory powered by the battery, wherein measuring a current supplied to the solenoid by the battery includes:
   measuring a total outlet current of the battery;
   determining a current supplied to the accessory; and
   subtracting the current supplied to the accessory from the total outlet current of the battery prior to energizing the solenoid.

4. The method of claim 1, wherein using a processor to determine the equivalent resistance and the equivalent inductance of the solenoid includes:
   determining whether the solenoid is of a first or a second predetermined type;
   calculating the equivalent resistance and the equivalent inductance as a function of a peak current and exponential time constant when the solenoid is of the first type; and
   estimating the equivalent resistance and the equivalent inductance by executing a predetermined parameter estimation technique via the controller when the solenoid is of the second type.

5. The method of claim 1, further comprising estimating a back-electro-motive force (EMF) of the solenoid by executing a predetermined parameter estimation technique via the controller, and automatically executing a second control action providing a second prognosis of the solenoid when the back-EMF exceeds a calibrated threshold.

6. The method of claim 5, wherein the first prognosis of the solenoid is a faulty winding of the solenoid, and the second prognosis of the solenoid is a faulty plunger of the solenoid.

7. A method for monitoring the state of health (SOH) of a solenoid powered by a battery, the method comprising:
   measuring each of a voltage and a peak current supplied to the solenoid by the battery, wherein the peak current defines a maximum value of an exponential rise in current delivered to the solenoid from the battery;
   using a controller to calculate each of an equivalent resistance and an equivalent inductance of the solenoid as a function of the peak current and an exponential time constant;
   subtracting each of the equivalent resistance and the equivalent inductance from a corresponding calibrated threshold to thereby determine a deviation of each of the equivalent resistance and the equivalent inductance from the corresponding calibrated threshold;
   subtracting the deviation from a value of 1 to thereby determine a state of health (SOH) factor for each of the equivalent resistance and the equivalent inductance;
   monitoring, via the controller, a trend of the SOH for each of the equivalent resistance and the equivalent inductance with respect to a corresponding calibrated lower limit; and
   automatically executing a first control action providing a first prognosis of the solenoid when the SOH factor of at least one of the equivalent resistance and the equivalent inductance drops below the corresponding calibrated lower limit.

8. The method of claim 7, further comprising:
   comparing the SOH factors for the equivalent resistance and the equivalent inductance;
   selecting the minimum SOH factor of the compared SOH factors;
   comparing the minimum SOH factor to the corresponding calibrated lower limit; and
   automatically executing the first control action when the minimum SOH factor drops below the corresponding calibrated lower limit.

9. The method of claim 8, the solenoid including a moveable plunger portion, wherein automatically executing the first control action includes:
   recording a first predetermined diagnostic code when the minimum SOH factor does not exceed the corresponding calibrated lower limit;
   estimating, via a controller, a back-electromotive force (back-EMF) of the solenoid when the minimum SOH factor exceeds the corresponding calibrated lower limit;
   comparing the back-EMF to a calibrated maximum back-EMF threshold; and setting a second predetermined diagnostic code indicating a malfunction of the moveable plunger portion when the back-EMF exceeds the calibrated maximum back-EMF threshold.

10. The method of claim 9, wherein estimating the back-EMF includes using the controller to execute a predetermined parameter estimation technique.

11. The method of claim 10, wherein the predetermined parameter estimation technique is selected from the group consisting of: linear least squares, polynomial least squares, and recursive least squares.

12. A solenoid monitoring system comprising:
an electro-mechanical solenoid;
a current sensor configured for measuring an electrical current supplied to the solenoid;
a voltage sensor configured for measuring a voltage level supplied to the solenoid; and
a controller in communication with the current sensor and the voltage sensor, and configured for continuously monitoring a state of health (SOH) of the solenoid;
wherein the controller is configured for:
determining each of an equivalent resistance and an equivalent inductance of the solenoid;
calculating a first SOH factor as a function of the equivalent resistance and a second SOH factor as a function of the equivalent inductance; and
executing a first control action providing a first prognosis of the solenoid when the value of one of the first and the second SOH factor falls below a corresponding calibrated lower limit.

13. The system of claim 12, wherein the solenoid has a moveable plunger portion that generates a back-electro-motive force (EMF) when moving, and wherein the controller is configured for estimating the back-EMF using a predetermined parameter estimation technique.

14. The system of claim 13, wherein the controller is configured for executing a second control action providing a second prognosis of the solenoid when the value of the back-EMF exceeds a calibrated maximum maximum back-EMF threshold.

15. The system of claim 14, wherein the first prognosis of the solenoid is a faulty winding of the solenoid, and the second prognosis of the solenoid is a faulty plunger of the solenoid.

16. The system of claim 13, wherein the solenoid is electrically connected to a vehicular starter motor, and is configured as an electro-magnetic switch for selectively activating the vehicular starter motor.

17. The system of claim 13, wherein the first control action includes at least one of: recording a diagnostic code on a computer-readable medium, activating an audio/visual signal, and displaying a message on a display device.

* * * * *